US012021619B2

(12) United States Patent
Lee et al.

(10) Patent No.: US 12,021,619 B2
(45) Date of Patent: Jun. 25, 2024

(54) METHOD AND DEVICE FOR PERFORMING PAC CODE-BASED HYBRID DECODING IN WIRELESS COMMUNICATION SYSTEM

(71) Applicant: SAMSUNG ELECTRONICS CO., LTD., Suwon-si (KR)

(72) Inventors: Donghun Lee, Suwon-si (KR); Seho Myung, Suwon-si (KR); Kwonjong Lee, Suwon-si (KR); Juho Lee, Suwon-si (KR); Min Jang, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 18/069,072

(22) Filed: Dec. 20, 2022

(65) Prior Publication Data
US 2024/0171308 A1    May 23, 2024

(30) Foreign Application Priority Data

Nov. 21, 2022  (KR) .................. 10-2022-0156682

(51) Int. Cl.
*H04L 1/00* (2006.01)
*H03M 13/00* (2006.01)
(Continued)

(52) U.S. Cl.
CPC .......... *H04L 1/0059* (2013.01); *H03M 13/23* (2013.01); *H03M 13/2933* (2013.01)

(58) Field of Classification Search
CPC .. H04L 1/0059; H03M 13/23; H03M 13/2933
See application file for complete search history.

(56) References Cited

U.S. PATENT DOCUMENTS

| 2018/0083655 A1 | 3/2018 | El-Khamy |
| 2018/0241416 A1 | 8/2018 | Axmon et al. |

(Continued)

FOREIGN PATENT DOCUMENTS

| CN | 113556133 A | 10/2021 |
| KR | 20180031555 A | 3/2018 |

(Continued)

OTHER PUBLICATIONS

International Search Report and Written Opinion of the International Searching Authority dated Aug. 18, 2023, in connection with International Application No. PCT/KR2022/018438, 10 pages.

(Continued)

*Primary Examiner* — Christine T. Tu

(57) ABSTRACT

The disclosure relates to a 5G or 6G communication system for supporting a higher data transmission rate than 4G communication systems such as LTE systems. The disclosure relates to a method and device for dynamically selecting, or simultaneously performing, PAC code-based Fano decoding and/or list decoding in a wireless communication system. The method for performing PAC code-based decoding by a reception device in a wireless communication system comprises identifying a specific criterion variable related to a channel state for selecting at least one of Fano decoding or list decoding for a signal received from a transmission device, comparing the specific criterion variable related to the channel state with a threshold, performing the Fano decoding in case that the specific criterion variable related to the channel state satisfies the threshold, and performing the list decoding in case that the specific criterion variable related to the channel state does not satisfy the threshold.

9 Claims, 6 Drawing Sheets

(51) Int. Cl.
    *H03M 13/23*     (2006.01)
    *H03M 13/29*     (2006.01)

(56) References Cited

U.S. PATENT DOCUMENTS

| | | |
|---|---|---|
| 2019/0058547 A1 | 2/2019 | Hof |
| 2021/0297094 A1* | 9/2021 | Hamelin ............... H04L 1/0052 |
| 2021/0351796 A1* | 11/2021 | Fujimori ............... H03M 13/45 |
| 2021/0367620 A1* | 11/2021 | Chaghooshi .......... H03M 13/23 |
| 2022/0103291 A1 | 3/2022 | Arikan |
| 2022/0368469 A1 | 11/2022 | Sun et al. |

FOREIGN PATENT DOCUMENTS

| | | |
|---|---|---|
| KR | 20190019798 A | 2/2019 |
| KR | 102158312 B1 | 9/2020 |
| WO | 2021188513 A1 | 9/2021 |

OTHER PUBLICATIONS

Liu et al., "Hybrid Decoding of CRC-Polar Codes," 2021 13th International Conference on Wireless Communications and Signal Processing (WCSP), 5 pages.

* cited by examiner (a) Decoding tree of PAC fano decoder

In worst case (low SNR, BLER), search process is performed total max cycle number (ex. $10^7$) times.

Instead of Fano decoder, exploit List decoder (b) Decoding tree of PAC fano decoder

METHOD AND DEVICE FOR PERFORMING PAC CODE-BASED HYBRID DECODING IN WIRELESS COMMUNICATION SYSTEM

CROSS-REFERENCE TO RELATED APPLICATION

This application is based on and claims priority under 35 U.S.C. § 119 to Korean Patent Application No. 10-2022-0156682, filed on Nov. 21, 2022, in the Korean Intellectual Property Office, the disclosure of which is herein incorporated by reference in its entirety.

BACKGROUND

1. Field

The disclosure relates to a method and device for performing polarization adjusted convolutional (PAC)-based decoding in a wireless communication system.

2. Description of Related Art

Considering the development of wireless communication from generation to generation, the technologies have been developed mainly for services targeting humans, such as voice calls, multimedia services, and data services. Following the commercialization of 5G (5th-generation) communication systems, it is expected that the number of connected devices will exponentially grow. Increasingly, these will be connected to communication networks. Examples of connected things may include vehicles, robots, drones, home appliances, displays, smart sensors connected to various infrastructures, construction machines, and factory equipment. Mobile devices are expected to evolve in various form-factors, such as augmented reality glasses, virtual reality headsets, and hologram devices. In order to provide various services by connecting hundreds of billions of devices and things in the 6G (6th-generation) era, there have been ongoing efforts to develop improved 6G communication systems. For these reasons, 6G communication systems are referred to as beyond-5G systems.

6G communication systems, which are expected to be commercialized around 2030, will have a peak data rate of tera (1,000 giga)-level bps and a radio latency less than 100 μsec, and thus will be 50 times as fast as 5G communication systems and have the 1/10 radio latency thereof.

In order to accomplish such a high data rate and an ultra-low latency, it has been considered to implement 6G communication systems in a terahertz band (for example, 95 GHz to 3THz bands). It is expected that, due to severer path loss and atmospheric absorption in the terahertz bands than those in mmWave bands introduced in 5G, technologies capable of securing the signal transmission distance (that is, coverage) will become more crucial. It is necessary to develop, as major technologies for securing the coverage, radio frequency (RF) elements, antennas, novel waveforms having a better coverage than orthogonal frequency division multiplexing (OFDM), beamforming and massive multiple input multiple output (MIMO), full dimensional MIMO (FD-MIMO), array antennas, and multiantenna transmission technologies such as large-scale antennas. In addition, there has been ongoing discussion on new technologies for improving the coverage of terahertz-band signals, such as metamaterial-based lenses and antennas, orbital angular momentum (OAM), and reconfigurable intelligent surface (RIS).

Moreover, in order to improve the spectral efficiency and the overall network performances, the following technologies have been developed for 6G communication systems: a full-duplex technology for enabling an uplink transmission and a downlink transmission to simultaneously use the same frequency resource at the same time; a network technology for utilizing satellites, high-altitude platform stations (HAPS), and the like in an integrated manner; an improved network structure for supporting mobile base stations and the like and enabling network operation optimization and automation and the like; a dynamic spectrum sharing technology via collision avoidance based on a prediction of spectrum usage; an use of artificial intelligence (AI) in wireless communication for improvement of overall network operation by utilizing AI from a designing phase for developing 6G and internalizing end-to-end AI support functions; and a next-generation distributed computing technology for overcoming the limit of UE computing ability through reachable super-high-performance communication and computing resources (such as mobile edge computing (MEC), clouds, and the like) over the network. In addition, through designing new protocols to be used in 6G communication systems, developing mechanisms for implementing a hardware-based security environment and safe use of data, and developing technologies for maintaining privacy, attempts to strengthen the connectivity between devices, optimize the network, promote softwarization of network entities, and increase the openness of wireless communications are continuing.

It is expected that research and development of 6G communication systems in hyper-connectivity, including person to machine (P2M) as well as machine to machine (M2M), will allow the next hyper-connected experience. Particularly, it is expected that services such as truly immersive extended reality (XR), high-fidelity mobile hologram, and digital replica could be provided through 6G communication systems. In addition, services such as remote surgery for security and reliability enhancement, industrial automation, and emergency response will be provided through the 6G communication system such that the technologies could be applied in various fields such as industry, medical care, automobiles, and home appliances.

SUMMARY

The disclosure provides a method and device for efficiently performing PAC code-based hybrid decoding in a wireless communication system.

The disclosure also provides a method and device for dynamically selecting and performing PAC code-based Fano decoding or list decoding in a wireless communication system.

The disclosure also provides a hybrid decoding and method capable of addressing latency in PAC code-based Fano decoding in a wireless communication system.

The disclosure also provides a method and device for simultaneously performing PAC code-based Fano decoding and list decoding in a wireless communication system.

According to an embodiment of the disclosure, a method of a reception device for performing PAC code-based decoding in a wireless communication system comprises identifying, for a signal received from a transmission device, a specific criterion variable related to a channel state for selecting at least one of a Fano decoding or a list decoding, comparing the specific criterion variable related to the channel state with a threshold, performing the Fano decoding in case that the specific criterion variable related to the channel state satisfies the threshold, and performing the list decoding when the specific criterion variable related to the channel state does not satisfy the threshold.

According to an embodiment of the disclosure, a method of a reception device for performing a PAC code-based decoding in a wireless communication system comprises receiving, from a transmission device, control information indicating a decoding scheme, performing, based on the control information, one of a Fano decoding or a list decoding on a signal received from the transmission device, identifying whether latency levels of the Fano decoding and the list decoding are reversed, and performing a decoding scheme of which decoding latency is reduced of the Fano decoding and the list decoding, in case that the latency levels are reversed.

According to an embodiment of the disclosure, a method of a reception device for performing PAC code-based decoding in a wireless communication system comprises simultaneously performing a Fano decoding and a list decoding on a signal received from a transmission device, in case that the Fano decoding is completed earlier than the list decoding, determining that the Fano decoding is reliable and outputting a result of the Fano decoding, and in case that the list decoding is completed earlier than the Fano decoding, outputting, based on a decoding reliability of the list decoding, a result of the list decoding or the result of the Fano decoding.

According to an embodiment of the disclosure, a reception device for performing a PAC code-based decoding in a wireless communication system comprises a transceiver and a processor configured to identify, for a signal received through the transceiver from a transmission device, a specific criterion variable related to a channel state for selecting at least one of a Fano decoding or a list decoding, compare the specific criterion variable related to the channel state with a threshold, perform the Fano decoding in case that the specific criterion variable related to the channel state satisfies the threshold, and perform the list decoding when the specific criterion variable related to the channel state does not satisfy the threshold.

According to an embodiment of the disclosure, a reception device for performing a PAC code-based decoding in a wireless communication system comprises a transceiver and a processor configured to receive, from a transmission device through the transceiver, control information indicating a decoding scheme, perform, based on the control information, one of a Fano decoding or a list decoding on a signal received from the transmission device, identify whether latency levels of the Fano decoding and the list decoding are reversed, and perform a decoding scheme of which decoding latency is reduced of the Fano decoding and the list decoding, in case that the latency levels are reversed.

According to an embodiment of the disclosure, a reception device for performing a PAC code-based decoding in a wireless communication system comprises a transceiver and a processor configured to simultaneously perform a Fano decoding and a list decoding on a signal received from a base station through the transceiver, in case that the Fano decoding is completed earlier than the list decoding, determine that the Fano decoding is reliable and output a result of the Fano decoding, and in case that the list decoding is completed earlier than the Fano decoding, output, based on a decoding reliability of the list decoding, a result of the list decoding or the result of the Fano decoding.

Wherein the reception device may be one of the UE and the base station, and the transmission device may be another of the UE and the base station.

Before undertaking the DETAILED DESCRIPTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely.

Moreover, various functions described below can be implemented or supported by one or more computer programs, each of which is formed from computer readable program code and embodied in a computer readable medium. The terms "application" and "program" refer to one or more computer programs, software components, sets of instructions, procedures, functions, objects, classes, instances, related data, or a portion thereof adapted for implementation in a suitable computer readable program code. The phrase "computer readable program code" includes any type of computer code, including source code, object code, and executable code. The phrase "computer readable medium" includes any type of medium capable of being accessed by a computer, such as read only memory (ROM), random access memory (RAM), a hard disk drive, a compact disc (CD), a digital video disc (DVD), or any other type of memory. A "non-transitory" computer readable medium excludes wired, wireless, optical, or other communication links that transport transitory electrical or other signals. A non-transitory computer readable medium includes media where data can be permanently stored and media where data can be stored and later overwritten, such as a rewritable optical disc or an erasable memory device.

Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

A more complete appreciation of the disclosure and many of the attendant aspects thereof will be readily obtained as the same becomes better understood by reference to the following detailed description when considered in connection with the accompanying drawings, wherein.

DETAILED DESCRIPTION

Figure 1:
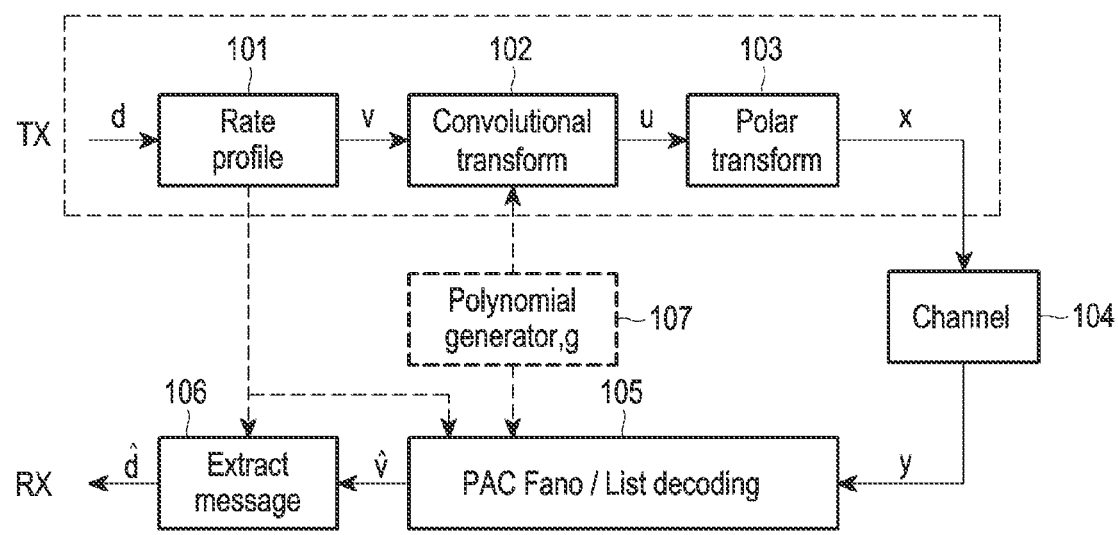
FIG. 1 illustrates a method for performing PAC code-based encoding and decoding in a wireless communication system according to various embodiments of the present disclosure.

FIGS. 1 through 7, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged system or device.

Hereinafter, the operational principle of the disclosure is described below with reference to the accompanying drawings. When determined to make the subject matter of the disclosure unclear, the detailed of the known functions or configurations may be skipped. The terms as used herein are defined considering the functions in the disclosure and may be replaced with other terms according to the intention or practice of the user or operator. Therefore, the terms should be defined based on the overall disclosure.

Advantages and features of the disclosure, and methods for achieving the same may be understood through the embodiments to be described below taken in conjunction with the accompanying drawings. However, the disclosure is not limited to the embodiments disclosed herein, and various changes may be made thereto. The embodiments disclosed herein are provided only to inform one of ordinary skilled in the art of the category of the disclosure. The disclosure is defined only by the appended claims. The same reference numeral denotes the same element throughout the specification.

It should be appreciated that the blocks in each flowchart and combinations of the flowcharts may be performed by computer program instructions.

Further, each block may represent a module, segment, or part of a code including one or more executable instructions for executing a specified logical function(s). Further, it should also be noted that in some replacement execution examples, the functions mentioned in the blocks may occur in different orders. For example, two blocks that are consecutively shown may be performed substantially simultaneously or in a reverse order depending on corresponding functions.

As used herein, the term "unit" means a software element or a hardware element such as a field-programmable gate array (FPGA) or an application specific integrated circuit (ASIC). A unit plays a certain role. However, the term "unit" is not limited as meaning a software or hardware element. A "unit" may be configured in a storage medium that may be addressed or may be configured to reproduce one or more processors. Accordingly, as an example, a "unit" includes elements, such as software elements, object-oriented software elements, class elements, and task elements, processes, functions, attributes, procedures, subroutines, segments of program codes, drivers, firmware, microcodes, circuits, data, databases, data architectures, tables, arrays, and variables. A function provided in an element or a "unit" may be combined with additional elements or may be split into sub elements or sub-units. Further, an element or a "unit" may be implemented to reproduce one or more CPUs in a device or a security multimedia card. According to embodiments, a " . . . unit" may include one or more processors.

As used herein, each of such phrases as "A/B," "A or B," "A and/or B," "at least one of A and B," "at least one of A or B," "A, B, or C," "at least one of A, B, and C," and "at least one of A, B, or C," may include all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order).

As used herein, terms for identifying access nodes, terms denoting network entities, terms denoting messages, terms denoting inter-network entity interfaces, and terms denoting various pieces of identification information are provided as an example for ease of description. Thus, the disclosure is not limited to the terms, and the terms may be replaced with other terms denoting objects with equivalent technical meanings.

In the disclosure, the base station (BS) is a network entity allocating resources to the UE and capable of communicating with the UE and may be at least one of an eNode B, a Node B, a gNB, a radio access network (RAN), an access network (AN), a RAN node, an integrated access/backhaul (IAB) node, a radio access unit, a base station controller, a node over network, or a transmission reception point (TRP). The user equipment (UE) may be at least one of a terminal, a mobile station (MS), cellular phone, smartphone, computer, or multimedia system capable of performing communication functions.

The disclosure may be applied to post-5G next-generation systems (e.g., 6G systems) as well as 5G systems.

5G communication systems, are required to simultaneously support various requirements to freely reflect various requirements from users and service providers. Services considered for 5G systems include, e.g., enhanced mobile broadband (eMBB), massive machine type communication (MMTC), or ultra-reliability low latency communication (URLLC).

eMBB aims to provide a further enhanced data transmission rate as compared with LTE, LTE-A, or LTE-pro. For example, eMBB for 5G systems needs to provide a peak data rate of 20 Gbps on download and a peak data rate of 10 Gbps on uplink in terms of one base station. 5G systems also need to provide an increased user perceived data rate while simultaneously providing such peak data rate. To meet such requirements, various transmit (TXyreceive (RX) techniques, as well as multiple input multiple output (MIMO), may need to further be enhanced. While LTE adopts a TX bandwidth up to 20 MHz in the 2 GHz band to transmit signals, the 5G system employs a broader frequency bandwidth in a frequency band ranging from 3 GHz to 6 GHz or more than 6 GHz to meet the data rate required for 5G communication systems.

mMTC is also considered to support application services, such as internet of things (IoT) in the 5G system. To efficiently provide IoT, mMTC is required to support massive UEs in the cell, enhance the coverage of the UE and the battery time, and reduce UE costs. IoT terminals are attached to various sensors or devices to provide communication functionality, and thus, it needs to support a number of UEs in each cell (e.g., 1,000,000 UEs/km2). Since mMTC-supportive UEs, by the nature of service, are highly likely to be located in shadow areas not covered by the cell, such as the underground of a building, it requires much broader coverage as compared with other services that the 5G communication system provides. mMTC-supportive UEs, due to the need for being low cost and difficulty in frequently exchanging batteries, are required to have a very long battery life, e.g., 10 years to 16 years.

URLLC is a mission-critical, cellular-based wireless communication service. For example, there may be considered a service for use in remote control for robots or machinery, industrial automation, unmanned aerial vehicles, remote health care, or emergency alert. This requires that URLLC provide very low-latency and very high-reliability communication. For example, URLLC-supportive services need to meet an air interface latency of less than 0.5 milliseconds simultaneously with a packet error rate of 10-5 or less. Thus, for URLLC-supportive services, the 5G communication system is required to provide a shorter transmit time interval (TTI) than those for other services while securing reliable communication links by allocating a broad resource in the frequency band.

Further, data traffic of the above-described three services, i.e., the eMBB, URLLC, and mMTC services, in the 5G system and/or the 6G system may be multiplexed and transmitted in the communication system. The services may adopt different TX/RX schemes and TX/RX parameters to meet their different requirements.

A polar code is an error-correcting code proposed by E. Arikan in 2008 and verified as achieving the channel capacity of a data transmission limit in all binary discrete memoryless channels (B-DMCs) while having low-encoding/complexity performance. The polar code has advantages in error correction performance and decoding complexity when transmitting a shorter code as compared with other channel capacity-approaching codes, such as turbo code or low-density parity-check (LDPC) code. Due to these advantages, the polar code was introduced for the purpose of transmitting short-length control information in the 3GPP NR standard.

The polar code is an error correction code that may be defined based on a phenomenon called channel polarization under the B-DMC assumption. When such a polar code is applied, each bit may have a channel W having independent and statistically identical characteristics. In this case, if the channel capacity of each channel is $0 \leq C(W) \leq 1$, it is theoretically possible to transfer as much information as $C(W)$ bits when a certain bit is transmitted through the channel. In the case of transmitting N bits through B-DMC without any operation, the channel through which each bit is transmitted has a channel capacity of $C(W)$, and as much information as $N \times C(W)$ bits in total may be theoretically transferred.

The basic concept of channel polarization is to combine or split the channels through which N bits are transmitted so that the channel capacity of the resultant channel experienced by a specific proportion of bits is close to 1 while the channel capacity of the resultant channel experienced by the remaining bits is close to 0. A simple concept of the polar code is to maximize the transmission effect by transmitting information bits with a high-channel capacity channel after channel polarization while fixing a low-channel capacity channel to a specific value without carrying information bits thereon.

The present disclosure provides a method of determining an appropriate threshold according to specific criterion variables (e.g., channel environment, block error rate (BLER)/ bit error rate (BER), signal length, or wait time) and then performing PAC Fano decoding (hereinafter, "Fano decoding") or PAC list decoding (hereinafter, "list decoding") by the receiving device (e.g., UE) in a wireless communication system. For example, in the disclosure, the UE may perform Fano decoding on a receive (RX) signal when the signal to noise ratio (SNR) of the RX signal is larger than the threshold (or equal to or larger than the threshold) and perform list decoding on the RX signal when the SNR of the RX signal is smaller than the threshold (or equal to or smaller than the threshold). List decoding is similar to the well-known polar successive cancellation list (SCL) decoding but additionally uses the polynomial generator g, which has been used for convolutional conversion in encoding, in the polar SCL decoding.

In the present disclosure, the transmission device (e.g., base station) may instruct the UE to perform PAC Fano decoding or PAC list decoding through higher layer signal and/or L1 signaling. In the present disclosure, the reception device may be one of the UE and the base station, and the transmission device may be another of the UE and the base station.

In the present disclosure, a higher layer signaling may be a signaling corresponding to at least one or a combination of one or more of the following signaling:
Master information block (MIB);
System information block (SIB) or SIB X (X=1, 2, . . . );
Radio resource control (RRC); or
Medium access control (MAC) control element (CE).

Further, L1 signaling may be a signaling corresponding to at least one or a combination of one or more of the following physical layer channels or signaling methods:
Physical downlink control channel (PDCCH);
Downlink control information (DCI);
UE-specific DCI;
Group common DCI;
Common DCI;
Scheduling DCI (e.g., DCI used for scheduling downlink or uplink data); or
Non-scheduling DCI (e.g., DCI not for the purpose of scheduling downlink or uplink data).

In the present disclosure, the UE may dynamically perform Fano decoding or list decoding based on, e.g., modulation coding scheme (MCS) table information based on the higher layer signal and/or L1 signaling received from the base station.

In the present disclosure, the UE simultaneously performs Fano decoding and list decoding and, if Fano decoding is completed earlier than list decoding, the UE may determine that Fano decoding is reliable and accordingly output the result of Fano decoding and, if list decoding is completed earlier than Fano decoding, and the SNR of the RX signal meets the threshold (i.e., larger than the threshold), the UE may determine that list decoding is reliable and accordingly output the result of list decoding.

FIG. 1 illustrates a method for performing PAC code-based encoding and decoding in a wireless communication system according to various embodiments of the present disclosure.

Referring to FIG. 1, a transmission device (e.g., base station) may perform PAC code-based encoding through the rate profile 101, convolutional transform 102, and polar transform 103 operations. In the rate profile 101, the information bits d are mapped to vector v based on the index set indicating the location indexes where the information bits are allocated. The information bits may be allocated to the location indexes of the index set, and 0's as frozen bits may be allocated to the remaining locations. In the convolutional transform 102, the input vector v and the polynomial generator g 107 are used to output the convolutionally transformed vector u. In the polar transform 103, the input vector u is used to output the polar-transformed x as the encoded signal. The encoded signal is received through the channel 104 by the reception device (e.g., UE). The UE performs PAC-based Fano decoding/list decoding 105 based on the index set in the polynomial generator g 107 and the rate profile 101 for RX signal y to output estimated information vector $\hat{V}$ and outputs estimated information bits $\hat{d}$ through message extraction 106 from the information vector $\hat{V}$.

In the present disclosure, PAC-based decoding may be performed using Fano decoding or list decoding. Fano decoding and list decoding both are well known as decoding schemes using decoding tree search and successive cancellation (SC). Fano decoding is a decoding scheme using a memory-efficient, backtracking search algorithm that performs forward and reverse search in decoding tree search, and list decoding uses a non-backtracking search algorithm that performs forward search without reverse search in decoding tree search. In the decoding tree search, the decoding tree is constituted of multiple nodes hierarchically connected and connection lines (i.e., paths) connecting the nodes. Reliability may be given to the connection line, and the reliability may be evaluated by a value called a path metric or metric. Decoding in the decoding tree may be performed through a forward search from the higher node to the lower node. Reliability is checked by comparing the magnitude of the metric with a specific threshold at each decoding step in each node. When the reliability is larger than the threshold (when it is determined that the reliability is sufficient), forward search may be continued and, in the opposite case, it is modified and re-searched under the assumption that an error occurs. The backtracking search algorithm may correct an occurring error through reverse search.

Figure 2:
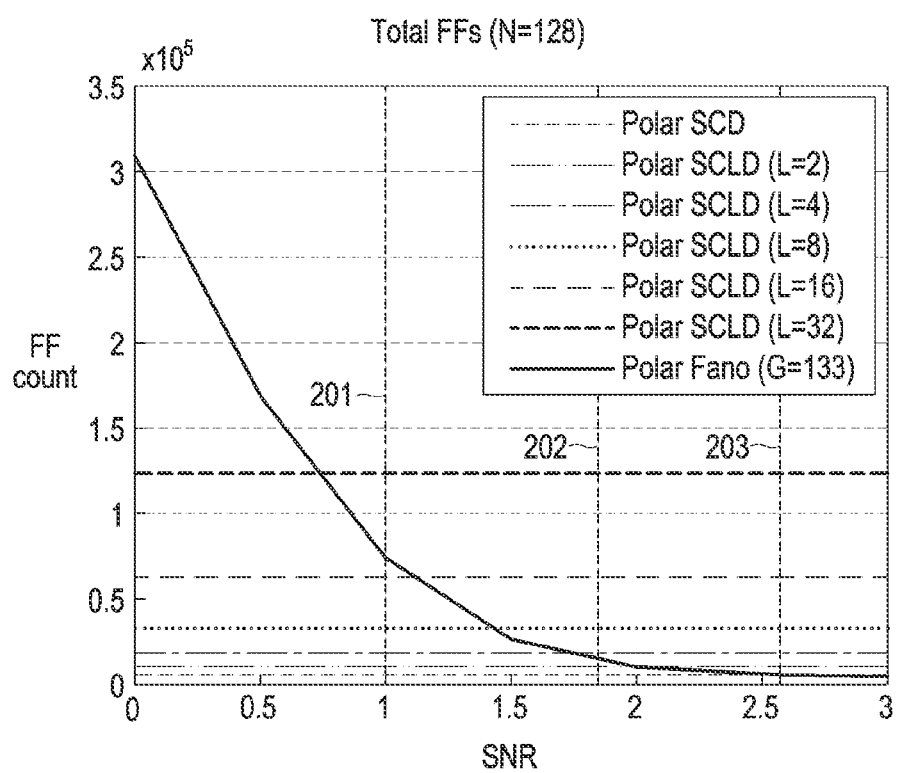
FIG. 2 illustrates example of a change in the complexity of Fano decoding and list decoding according to a channel state (e.g., SNR) according to various embodiments of the present disclosure.

FIG. 2 illustrates an example of a change in the complexity of Fano decoding and list decoding based on to a channel state (e.g., SNR) according to various embodiments of the present disclosure.

FIG. 2 shows comparison in flipflop-based complexity according to SNR between Fano decoding and list decoding, and the horizontal axis denotes the SNR while the vertical axis denotes the complexity (e.g., FF count). It may be identified that Fano decoding exhibits complexity increasing as the channel state is poorer (e.g., as the SNR decreases) and complexity decreasing as the channel state is better (e.g., as the SNR increases). The complexity and latency in decoding are proportional to each other. Therefore, as the complexity is reduced, the latency in decoding is reduced. In the example of FIG. 2, it may be identified that L=2, 4, 8, 16, and 32 of list decoding (polar SCLD in FIG. 2) are the list size and, once the list size is determined in list decoding, the complexity remains the same regardless of SNR changes, and as the list size increases, the complexity increases as well.

In a high-SNR communication environment, use of Fano decoding may reduce complexity (latency) relatively more than use of list decoding when the UE performs decoding. In general, it is known that in relation to decoding performance, Fano decoding has relatively higher performance than list decoding in the entire SNR region, and as the SNR increases, Fano decoding has better performance than list decoding. In low SNR regions, Fano decoding and list decoding have no or little performance difference, but Fano decoding has latency issues.

Table 1 below shows an example of comparison in complexity between Fano decoding (i.e., SC decoding) and SCL decoding according to the SNR (in the case of list size L=8, and cyclic redundancy check (CRC) aided-SCL (CA-SCL)). As the SNR increases, the frame error rate (FER) decreases. In Table 2 below, the 1 st, 2nd and 3rd dashed lines indicate the FERs of Fano decoding at reference numerals 201, 202 and 203 in FIG. 2, respectively.

TABLE 1

| | Complexity gain of PAC FANO decoding (compared to) | |
|---|---|---|
| FER (SNR) | CA-SCL decoding (5 G NR, L = 8) | SC decoding |
| $10^{-1}$ (@ 1 dB) | ×2.15 | ×15.45 |
| $10^{-2}$ (@ 1.8 dB) | ×0.51 | ×3.66 |
| $10^{-3}$ (@ 2.55 dB) | ×0.2 | ×1.44 |

TABLE 2

| | PAC FANO decoding |
|---|---|
| ✓ $1^{st}$ dashed line | FER = $10^{-1}$ |
| ✓ $2^{nd}$ dashed line | FER = $10^{-2}$ |
| ✓ $3^{rd}$ dashed line | FER = $10^{-3}$ |

Figure 3:
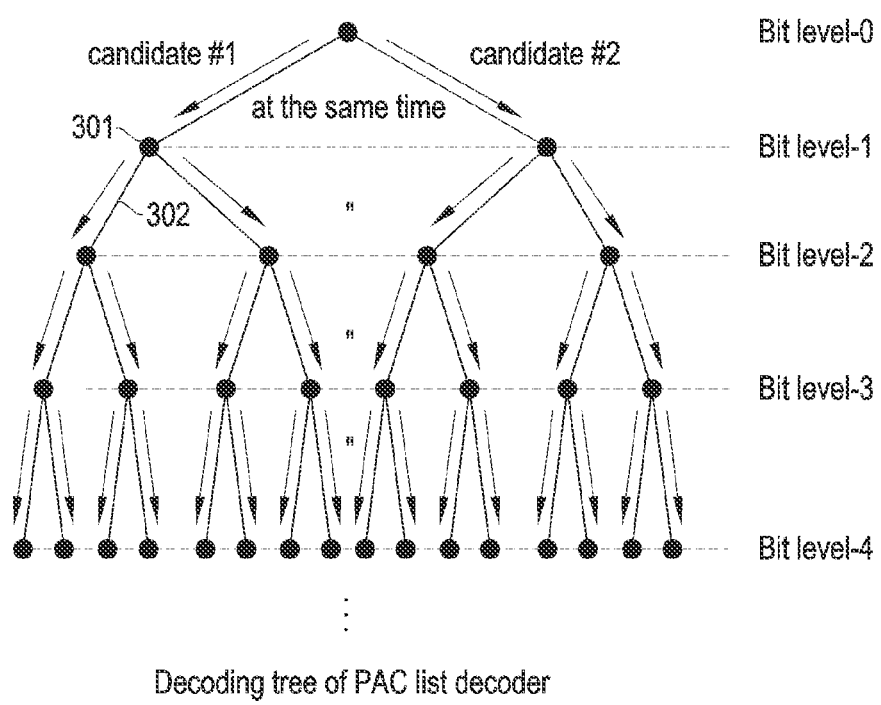
FIG. 3 illustrates an example of a decoding tree of a list decoder performing list decoding according to various embodiments of the present disclosure.

FIG. 3 illustrates an example of a decoding tree of a list decoder performing list decoding according to various embodiments of the present disclosure.

In the example of FIG. 3, the decoding tree is composed of a plurality of hierarchically connected nodes 301 and a plurality of connection lines 302 connecting the nodes. Each node may have at least two or more lower nodes. At bit level 0, the list decoder estimates the candidate bit values (candidate #1, candidate #2) of "0" and "1" and performs a convolutional transform on the estimated bit values and calculates a reliability value (i.e., path metric) for each. The reliability value may be calculated using a log-likelihood ratio (LLR). At bit level 1, each node calculates the values by estimating candidate bit values in the same manner as is used at bit level 0. In this manner, decoding may be performed through forward search from the higher node(s) to lower node(s). For example, at bit level 3, each of 16 bit values may be estimated through 8 nodes to form a different candidate vector. In this case, if the input list size L is 8, an operation for pruning 8 candidate vectors having relatively low reliability among the 16 candidate bit values may be performed.

The LLR vector value Ly calculated from the signal received through the channel, as an input to the list decoder performing list decoding in the above-described manner is given, and the list decoder performs decoding in such a manner as to additionally use the polynomial generator g, which was used when encoding, in the polar SCL decoding, outputting estimated information vector $\hat{V}$. The operation of the list decoding may be performed as shown in Table 3 below as an example. In Table 3, L is the input list size, and Lnow is the current list size.

TABLE 3

- Path expansion for level-l of l-th candidate (total $L_{now}$ candidates)
1. Bit estimation (0 and 1)
    $\theta_i^l = 0$ & $\theta_i^{l+1} = 1$
2. Convolution transform
    $\hat{u}_i^l = \text{convTrans}(\hat{v}_i^l, \text{state}_i^l)$
    $\hat{u}_i^{l+2} = \text{convTrans}(\hat{v}_i^{l+1}, \text{state}_i^l)$
3. LLR value calculation (from SC decoding)
4. Path metric calculation
- Pruning
    • if $L_{now} = 2 + L$, sort candidtaes based on path metric and prune the low L candidates
    • else, continue 1, –4.

Figure 4:
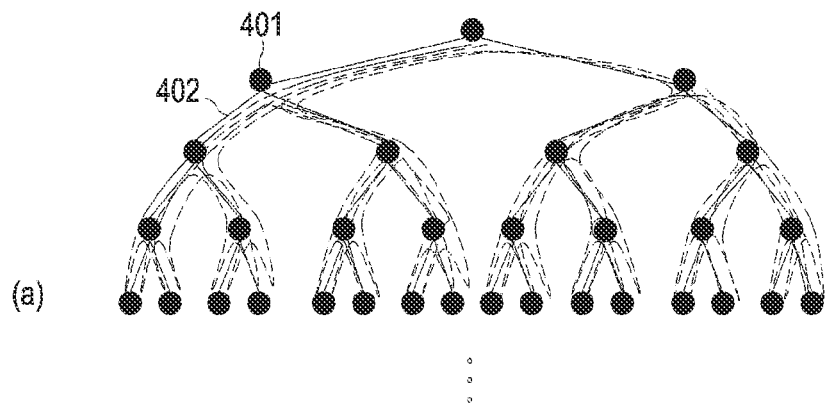
FIG. 4 illustrates an example of a comparison between a decoding tree of a Fano decoder and a decoding tree of a list decoder according to various embodiments of the present disclosure.
Figure 4:
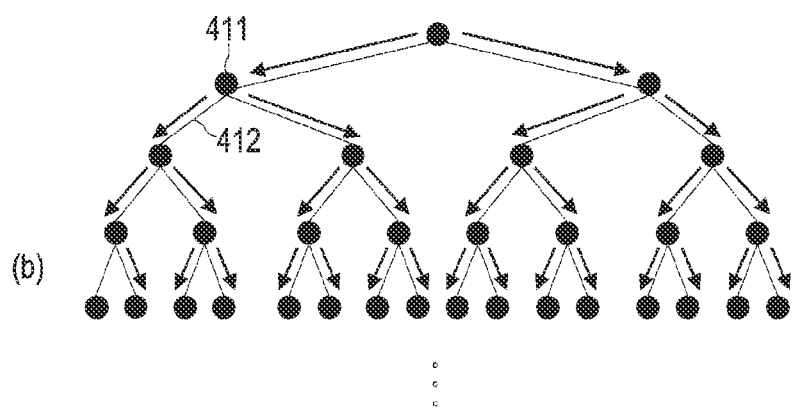

FIG. 4 illustrates an example of a comparison between a decoding tree of a Fano decoder and a decoding tree of a list decoder according to various embodiments of the present disclosure.

(a) of FIG. 4 illustrates a decoding tree of a Fano decoder (decoding), and (b) of FIG. 4 illustrates a decoding tree of a list decoder (decoding). In (a) and (b) of FIG. 4, the decoding trees are composed of a plurality of hierarchically connected nodes 401 and 411 and a plurality of connection lines 402 and 412 connecting the nodes as described above. Each node may have at least two or more lower nodes.

In (a) of FIG. 4, since the Fano decoder (decoding) uses a backtracking search algorithm performing forward and reverse search in decoding tree search, if the channel state is poor (i.e., low SNR or high BLER), repetitive re-search may be excessively performed in the path(s) searched before in the decoding tree. Accordingly, in the Fano decoder (decoding), the poorer the channel state is, the more latency occurs during decoding. Further, the Fano decoder (decoding) has no other way but to use CRC to address the latency issue when the channel state is poor. In this case, it is more efficient to perform list decoding in (b) of FIG. 4 which may provide constant throughput by performing decoding within a predetermined time (i.e., without latency) regardless of the channel state (e.g., SNR) rather than performing Fano decoding. Since the list decoder (decoding) uses a non-backtracking search algorithm in decoding tree search, it may relatively mitigate latency during decoding when the channel state is poor.

Conversely, in (a) of FIG. 4, in a good channel state (i.e., high SNR or low BLER), the Fano decoder (decoding) has a lower chance of performing repetitive re-search in the path(s) searched before in the decoding tree and does not cause latency during decoding. In this case, it is more efficient to perform Fano decoding capable of enhancing throughput as compared with list decoding (Fano decoding provides variable throughput).

Figure 5:
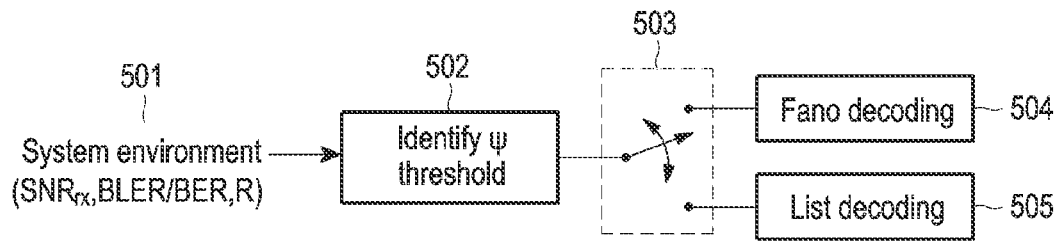
FIG. 5 illustrates a method for performing PAC code-based hybrid decoding in a wireless communication system according to various embodiments of the present disclosure.

FIG. 5 illustrates a method for performing PAC code-based hybrid decoding in a wireless communication system according to various embodiments of the present disclosure. Here, hybrid decoding may include performing Fano decoding, performing list decoding, and simultaneously performing Fano decoding and list decoding.

Referring to FIG. 5, in the disclosure, the reception device (e.g., UE) may identify a threshold $\psi$ set/determined according to a specific criterion (e.g., SNR, BLER/BER, signal length, wait time, latency time, information vector length (or code length), and code rate R) variable 501 in the wireless communication system and identify/determine whether the RX signal from the transmission device (e.g., base station) meets the threshold W (502). The specific criterion variable 501 may be set/determined to differ depending on the communication system environment. For example, the specific criterion variable 501 may be varied to meet, e.g., the above-described service requirements, such as eMBB, URLLC, or mMTC service, or various DC scenarios, such as E-UTRA-NR dual connectivity (EN-DC) or NR-E-UTRA dual connectivity (NE-DC).

The target SNR, target BLER/BER, target wait time, signal length, latency time, information vector length (or code length), and code rate R may be set/determined to differ depending on the service requirements or DC scenarios, and the threshold W may be set/determined to match the specific criterion variable 501. Further, as the specific criterion variable 501 and/or threshold $\psi$, parameter(s) predetermined in the communication system or parameter(s) set periodically/aperiodically by the base station may be used, or at least one of the specific criterion variable 501 and/or threshold $\psi$ may be set/determined by the UE. To select a decoding scheme, one or a combination of two or more of the exemplified specific criteria may be used as the specific criterion variable 501.

In the example of FIG. 5, the UE may compare the SNR of the RX signal from the base station with the threshold $\psi$, dynamically selecting/switching the decoding scheme (503). For example, the UE may perform Fano decoding on the RX signal when the SNR of the RX signal from the base station is larger than the threshold (or equal to or larger than the threshold) and perform list decoding on the RX signal when the SNR of the RX signal is smaller than the threshold (or equal to or smaller than the threshold) (505). Assuming that the threshold $\psi=1.2$ dB, and the SNR of the RX signal is 1.5 dB, since the SNR of the RX signal is larger than the threshold, the UE may determine that the channel state is good, performing Fano decoding. Assuming that the threshold $\psi=1.2$ dB, and the SNR of the RX signal is 0.8 dB, since the SNR of the RX signal is smaller than the threshold, the UE may determine that the channel state is not good, performing list decoding.

According to an embodiment of the disclosure, the base station may indicate the decoding scheme to the UE through higher layer signal and/or L1 signaling. For example, when the base station indicates the decoding scheme through DCI, if the field indicating the decoding scheme in the DCI is "0," Fano decoding, as the decoding scheme, may be indicated to the UE and, if the field is "1," list decoding as the decoding scheme may be indicated to the UE.

According to an embodiment, when the field in the DCI is configured with two-bit information, if the field indicating the decoding scheme in the DCI is "00," Fano decoding as the decoding scheme may be indicated to the UE, if the field is "01," list decoding as the decoding scheme may be indicated to the UE, and if the field is "10," simultaneously performing Fano decoding and list decoding may be indicated to the UE. The operation of simultaneously performing Fano decoding and list decoding is described below.

According to an embodiment, the decoding scheme may be determined as a desired one of Fano decoding and list decoding, by the UE, rather than being indicated by the base station. In this case, for example, the UE may continuously check the communication system environment, identifying whether the latency levels of Fano decoding and list decoding are reversed. In other words, the UE may identify whether decoding latency in either Fano decoding or list decoding is further increased or decreased.

Figure 6:
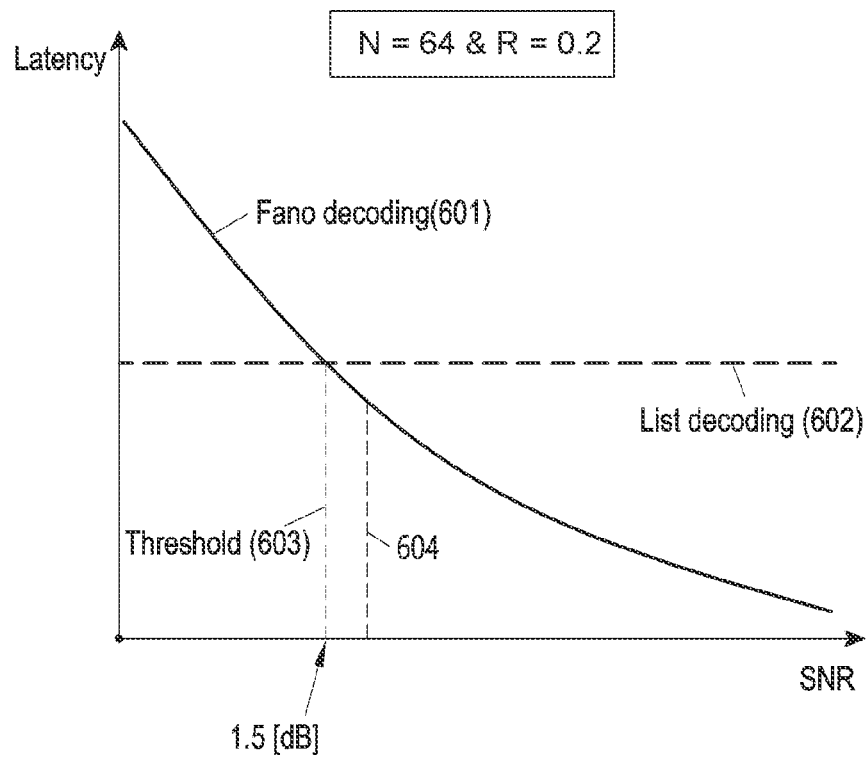
FIG. 6 illustrates a method for performing hybrid decoding based on whether latency levels of Fano decoding and list decoding are reversed in a wireless communication system according to various embodiments of the present disclosure.

In the example of FIG. 6, reference numeral 603 indicates an example threshold at the same latency level of Fano decoding and list decoding, and the latency levels may be reversed depending on, e.g., SNR or BLER. In other words, the UE may compare, e.g., SNR with the threshold in the manner shown in FIG. 5 to select Fano decoding or list decoding to reduce decoding latency according to the SNR or BLER of the RX signal with respect to the threshold. FIG. 6 illustrates an example of decoding latency according to an SNR change in Fano decoding and list decoding under the assumption of code length N=64 and code rate R=0.2. The UE may identify/determine a threshold at which the latency levels are reversed based on preconfigured table information. It may be configured in the table information.

Tables 4 and 5 show examples BLER or SNR thresholds ($\psi1, \% \psi2, \ldots$) mapped to combinations of the code length (N=64, 128, ...) and the code rate (R=0.2, ...) when the specific criterion variables are BLER and SNR, respectively. The BLER or SNR thresholds ($\psi1, \psi2, \ldots$) may also be understood as target BLER and SNR.

TABLE 4

| N = 64, 128, . . . | | BLER |
|---|---|---|
| rate R = 0.2 | $\Psi^1 = 10^{-1}$ | $\Psi^2 = 2 \times 10^{-1}$ |
| . | . | . |
| . | . | . |
| . | . | . |

TABLE 5

| N = 64, 128, . . . | | SNR |
|---|---|---|
| rate R = 0.2 | $\Psi^1 = 1$ [dB] | $\Psi^2 = 1.5$ [dB] |
| . | . | . |
| . | . | . |
| . | . | . |

The UE performs, e.g., list decoding 602 according to the control information (e.g., DCI) received from the base station before the latency levels are reversed and, if the SNR of the RX signal becomes larger than the threshold (e.g., $\psi=1.5$) 603 as indicated by reference numeral 604 (i.e., when the latency of Fano decoding 601 is smaller than the latency of list decoding 602), switch the decoding scheme to Fano decoding.

According to an embodiment, in the case where the UE determines the decoding scheme, the base station may explicitly receive information about the decoding scheme determined by the UE from the UE or may implicitly identify the decoding scheme to be used by the UE based on, e.g., a threshold preset between the base station and the UE.

As described above, according to the disclosure, the UE may identify a specific criterion (e.g., SNR, BLER/BER, signal length, wait time, latency time, information vector length (or code length), or code rate R) for selecting the decoding scheme, compare the identified specific criterion with the threshold, and dynamically perform at least one of Fano decoding or list decoding on downlink signals/data based on the comparison result, thereby reducing decoding latency. Further, according to the disclosure, the UE may perform Fano decoding or list decoding according to the control information received from the base station, identify whether the latency levels of Fano decoding and list decoding are reversed and, if the latency levels are reversed, dynamically perform at least one of Fano decoding or list decoding, reducing decoding latency.

Alternatively, the UE may dynamically perform at least one of Fano decoding or list decoding based on channel quality indicator/indication (CQI) table information or MCS table information provided through higher layer signal and/or L1 signaling from the base station, reducing decoding latency.

Specifically, the UE may identify/determine the target BLER which is one of the specific criterion variables for selecting the decoding scheme based on the CQI table information. If the target BLER is low, the operation SNR of the UE is relatively high and, if the target BLER is high, the operation SNR of the UE is relatively low. The reference based on which the target BLER is high/low may be determined based on the CQI table information. As the CQI table information, e.g., "table1"(corresponding to Table 5.2.2.1-2), "table2"(corresponding to Table 5.2.2.1-3), "table3"(corresponding to Table 5.2.2.1-4) or "table4"(corresponding to Table 5.2.2.1-5) may be used which is specified in 3GPP NR standard TS 38.214 section 5.2.2.1 and TS 38.331.

Further, in the disclosure, the UE may dynamically perform at least one of Fano decoding or list decoding based on the MCS index set provided from the base station through the DCI and/or the MCS table information, reducing decoding latency. Since the target BLER which is one of the specific criterion variables for selecting the decoding scheme differs depending on the MCS table information, the decoding scheme may be selected based on the MCS table information. Higher order modulation is used when the MCS index is high, meaning that the channel state of the UE is a communication environment in which it may have a relatively high SNR. Therefore, the UE may select the decoding scheme based on the MCS index. The MCS table information may use, e.g., TS 38.214 section 5.1.3.1 in the 3GPP NR standard. For example, in TS 38.214 section 5.1.3.1, Table 5.1.3.1-1: MCS index table 1 for PDSCH may be used for target BLER=10-1, and Table 5.1.3.1-3: MCS index table 3 for PDSCH may be used for target BLER=10-5.

In another embodiment of the disclosure, the UE may simultaneously perform Fano decoding and list decoding. For example, if Fano decoding is completed earlier than list decoding, the UE may determine that Fano decoding is reliable and accordingly output the result of Fano decoding. If list decoding is completed earlier than Fano decoding, the UE may determine that list decoding is reliable and accordingly output the result of list decoding if the result of list decoding meets the threshold (e.g., when larger than the threshold) based on a threshold (which differs from the threshold for comparison with SNR as described in connection with FIG. 5) for the path metric indicating the decoding reliability derived from list decoding. When the list decoding result fails to meet the threshold (i.e., when smaller than the threshold), the UE determines that list decoding is unreliable and awaits and outputs the result of Fano decoding performed simultaneously with list decoding.

Figure 7:
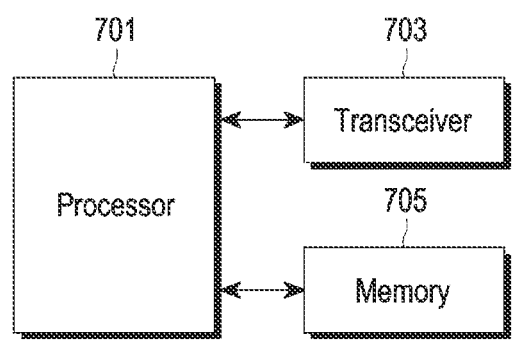
FIG. 7 illustrates an example of a configuration of a network entity in a wireless communication system according to various embodiments of the present disclosure.

FIG. 7 illustrates an example of a configuration of a network entity supporting PAC code-based hybrid decoding in a wireless communication system according to various embodiments of the present disclosure. The configuration of FIG. 7 corresponds to the UE or base station described in connection with the embodiments of FIGS. 1 to 6.

The network entity of FIG. 7 may include a processor 701, a transceiver 703, and a memory 705. The processor 701, transceiver 703, and memory 705 of the network entity of FIG. 7 may be operated according to the methods provided in the embodiments of FIGS. 1 to 6. However, the components of the network entity are not limited thereto. For example, the network entity may include more or fewer components than the above-described components. The processor 701, the transceiver 703, and the memory 705 may be implemented in the form of a single chip. The transceiver 703 collectively refers to the receiver of the network entity and the transmitter of the network entity and may transmit and receive signals to/from a UE or another network entity. The transmitted/received signals may include at least one of control information and data. To that end, the transceiver 703 may include a wired/wireless transceiver and may include various components for transmitting/receiving signals.

The transceiver 703 may receive signals, output the signals to the processor 701, and transmit the signals output from the processor 701. Further, the transceiver 703 may receive the communication signal and output it to the processor 701 and transmit the signal output from the processor 701 to another network entity through the network. The memory 705 may store programs and data necessary for the operation of the network entity according to at least one of the embodiments of FIGS. 1 to 6. Further, the memory 705 may store control information or data that is included in the signal obtained by the network entity. The memory 705 may include a storage medium, such as ROM, RAM, hard disk, CD-ROM, and DVD, or a combination of storage media.

Further, the processor 701 may control a series of processes so that the network entity may operate according to at least one of the embodiments of FIGS. 1 to 6. For example, the processor 701 may include at least one processor and may control the operation a Fano decoder and/or a list decoder performing at least one of Fano decoding or list decoding. Further, the processor 701 may dynamically select and perform one of predetermined or list decoding or simultaneously perform predetermined and list decoding based on a specific criterion variable and a threshold related to the channel state and output the decoding result according to embodiments of the disclosure.

The methods according to the embodiments descried in the specification or claims of the disclosure may be implemented in hardware, software, or a combination of hardware and software.

When implemented in software, there may be provided a computer readable storage medium storing one or more programs (software modules). One or more programs stored in the computer readable storage medium are configured to be executed by one or more processors in an electronic device. One or more programs include instructions that enable the electronic device to execute methods according to the embodiments described in the specification or claims of the disclosure.

The programs (software modules or software) may be stored in random access memories, non-volatile memories including flash memories, read-only memories (ROMs), electrically erasable programmable read-only memories (EEPROMs), magnetic disc storage devices, compact-disc ROMs, digital versatile discs (DVDs), or other types of optical storage devices, or magnetic cassettes. Or the programs may be stored in a memory constituted of a combination of all or some thereof. As each constituting memory, multiple ones may be included.

The programs may be stored in attachable storage devices that may be accessed via a communication network, such as the Internet, Intranet, local area network (LAN), wide area network (WLAN), or storage area network (SAN) or a communication network configured of a combination thereof. The storage device may connect to the device that performs embodiments of the disclosure via an external port. A separate storage device over the communication network may be connected to the device that performs embodiments of the disclosure.

In the above-described specific embodiments, the components included in the disclosure are represented in singular or plural forms depending on specific embodiments provided. However, the singular or plural forms are selected to be adequate for contexts suggested for ease of description, and the disclosure is not limited to singular or plural components. As used herein, the singular forms "a," "an," and "the" are intended to include the plural forms as well, unless the context clearly indicates otherwise.

Although specific embodiments of the disclosure have been described above, various changes may be made thereto without departing from the scope of the disclosure. Thus, the scope of the disclosure should not be limited to the above-described embodiments, and should rather be defined by the following claims and equivalents thereof.

What is claimed is:

1. A method of a reception device for performing a polarization adjusted convolutional (PAC) code-based decoding in a wireless communication system, the method comprising:
    identifying, for a signal received from a transmission device, a specific criterion variable related to a channel state for selecting at least one of a Fano decoding or a list decoding;
    comparing the specific criterion variable related to the channel state with a threshold;
    performing the Fano decoding in case that the specific criterion variable related to the channel state satisfies the threshold; and
    performing the list decoding in case that the specific criterion variable related to the channel state does not satisfy the threshold.

2. The method of claim 1, wherein the specific criterion variable includes a signal-to-noise ratio (SNR) of the signal, and wherein the Fano decoding is performed in case that the SNR is greater than the threshold and the list decoding is performed in case that the SNR is less than the threshold.

3. The method of claim 1, wherein the specific criterion variable includes at least one of an SNR, a block error rate (BLER)/bit error rate (BER), a signal length, a wait time, a latency time, an information vector length, a code length, or a code rate, and
    wherein the specific criterion variable is configured by the transmission device.

4. A method of a reception device for performing polarization adjusted convolutional (PAC) code-based decoding in a wireless communication system, the method comprising:
    simultaneously performing a Fano decoding and a list decoding on a signal received from a transmission device;
    in case that the Fano decoding is completed earlier than the list decoding, determining that the Fano decoding is reliable and outputting a result of the Fano decoding; and
    in case that the list decoding is completed earlier than the Fano decoding, outputting, based on a decoding reliability of the list decoding, a result of the list decoding or the result of the Fano decoding.

5. The method of claim 4, further comprising determining the decoding reliability of the list decoding based on a threshold for a path metric of the list decoding,
    wherein, in case that the result of the list decoding satisfies the threshold, the result of the list decoding is output.

6. The method of claim 5, wherein, in case that the result of the list decoding does not satisfy the threshold, the result of the Fano decoding is output.

7. A reception device for performing a polarization adjusted convolutional (PAC) code-based decoding in a wireless communication system, the reception device comprising:
- a transceiver; and
- a processor operably connected to the transceiver, the processor configured to:
    - identify, for a signal received through the transceiver from a transmission device, a specific criterion variable related to a channel state for selecting at least one of a Fano decoding or a list decoding,
    - compare the specific criterion variable related to the channel state with a threshold;
    - perform the Fano decoding in case that the specific criterion variable related to the channel state satisfies the threshold, and
    - perform the list decoding in case that the specific criterion variable related to the channel state does not satisfy the threshold.

8. The reception device of claim 7, wherein the specific criterion variable includes a signal-to-noise ratio (SNR) of the signal, and wherein the processor is configured to perform the Fano decoding in case that the SNR is greater than the threshold and perform the list decoding in case that the SNR is less than the threshold.

9. The reception device of claim 7, wherein the specific criterion variable includes at least one of an SNR, a block error rate (BLER)/bit error rate (BER), a signal length, a wait time, a latency time, an information vector length, a code length, or a code rate, and wherein the specific criterion variable is configured by the transmission device.

* * * * *